United States Patent
Lee et al.

(10) Patent No.: US 9,343,342 B2
(45) Date of Patent: May 17, 2016

(54) HANDLER FOR TESTING SEMICONDUCTOR DEVICE WITH DETECTING SENSORS

(71) Applicant: TECHWING CO., LTD., Hwaseong-si, Gyeonggi-do (KR)

(72) Inventors: Jin-Bok Lee, Hwaseong-si (KR); Gun Wo Lee, Uijeongbu-si (KR)

(73) Assignee: TECHWING CO., LTD., Hwaseong-si, Gyeonggi-do (KR)

( * ) Notice: Subject to any disclaimer, the term of this patent is extended or adjusted under 35 U.S.C. 154(b) by 0 days.

(21) Appl. No.: 14/625,293

(22) Filed: Feb. 18, 2015

(65) Prior Publication Data
US 2015/0270152 A1 Sep. 24, 2015

(30) Foreign Application Priority Data
Mar. 18, 2014 (KR) ........................ 10-2014-0031668

(51) Int. Cl.
| *H01L 21/687* | (2006.01) |
| *H01L 21/677* | (2006.01) |
| *H01L 21/66* | (2006.01) |
| *H01L 21/68* | (2006.01) |
| *G01R 31/28* | (2006.01) |

(52) U.S. Cl.
CPC ...... *H01L 21/67721* (2013.01); *G01R 31/2893* (2013.01); *H01L 21/67706* (2013.01); *H01L 21/68* (2013.01); *H01L 21/68764* (2013.01); *H01L 21/68771* (2013.01); *H01L 21/68778* (2013.01); *H01L 22/34* (2013.01)

(58) Field of Classification Search
CPC ............... H01L 21/68764; H01L 21/68771; H01L 21/68778; H01L 22/14; H01L 22/34
See application file for complete search history.

(56) References Cited

U.S. PATENT DOCUMENTS

| 6,515,470 B2 * | 2/2003 | Suzuki ................... B65G 57/04 324/750.03 |
| 6,594,887 B1 * | 7/2003 | Okuda ............... H05K 13/0452 29/739 |
| 2003/0085160 A1* | 5/2003 | Shim ................. H01L 21/67778 209/573 |
| 2007/0182437 A1* | 8/2007 | Shim .................. G01R 31/2867 324/750.13 |
| 2008/0298946 A1* | 12/2008 | Shim .................. G01R 31/2886 414/749.1 |
| 2013/0068592 A1* | 3/2013 | Lofaro .............. H01L 21/68764 198/617 |
| 2015/0086303 A1* | 3/2015 | Nakagawa ........ H01L 21/67173 414/222.13 |

FOREIGN PATENT DOCUMENTS

| KR | 10-2002-0077596 A | 10/2002 |
| KR | 10-2009-0012667 A | 2/2009 |
| KR | 10-2014-0133976 A | 11/2014 |
| KR | 10-2014-0136076 A | * 11/2014 |

* cited by examiner

Primary Examiner — Gerald McClain
(74) Attorney, Agent, or Firm — Novick, Kim & Lee, PLLC; Jae Youn Kim (57) ABSTRACT

A handler for testing a semiconductor device which is used when testing the fabricated semiconductor device. The handler for testing a semiconductor device includes a stacker to supply and accommodate a customer tray and a position selecting device to move the stacker and select a position of the stacker. By efficiently operating the stacker, the handler is able to continuously handle a large amount of semiconductor devices in a same testing process or continuously handle semiconductor devices in different lots, and equipment is prevented from becoming larger or having more complex designs so that required space, production costs and manpower are reduced and operating rates are improved.

3 Claims, 5 Drawing Sheets

FIG. 5

HANDLER FOR TESTING SEMICONDUCTOR DEVICE WITH DETECTING SENSORS

BACKGROUND OF THE INVENTION

1. Field of the Invention

The present invention relates to a handler for testing a semiconductor device, which is used when testing a fabricated semiconductor device, and more particularly, to a handler for receiving and supplying a customer tray.

2. Description of the Related Art

A handler for testing a semiconductor device (hereinafter, referred to as handler) withdraws semiconductor devices fabricated through a predetermined fabricating process from a customer tray, electrically connects the semiconductor devices to a tester, and when the test is completed, classifies the semiconductor devices according to the test result to insert the semiconductor devices into the empty customer tray.

The handler have evolved into various forms such as the form proposed in Korean Unexamined Patent Publication No. 10-2009-0012667 or in Korean Unexamined Patent Publication No. 10-2002-0077596 according to a purpose of uses such as a type of the semiconductor device, the purpose of the test or an environment.

In general, the handler includes multiple stackers to receive and supply the customer tray, in which the semiconductor device is loaded or can be loaded.

The multiple stackers include a supplying stacker to supply the customer tray in which the semiconductor device to be tested is loaded, and an accommodating stacker to accommodate the customer tray in which the semiconductor device is loaded after the test is completed. In this case, at least one supplying stacker and at least one accommodating stacker are provided. In addition, a predetermined number of customer trays may be accommodated in the supplying stacker or the accommodating stacker.

Meanwhile, the semiconductor devices are tested under the same environmental condition in a unit of one lot. Therefore, it is preferable to continuously test the semiconductor devices in the unit of one lot.

However, the quantity of semiconductor devices in the unit of one lot occasionally exceeds the quantity of semiconductor devices loadable in the customer trays that may be accommodated in the supplying stacker. In this case, when the test of some semiconductor devices in the one lot is completed, a worker supplies the customer tray in which the remaining semiconductor devices are loaded. Therefore, the manpower of the worker is consumed, and the operating rate of the handler decreases due to the above work.

Figure 1:
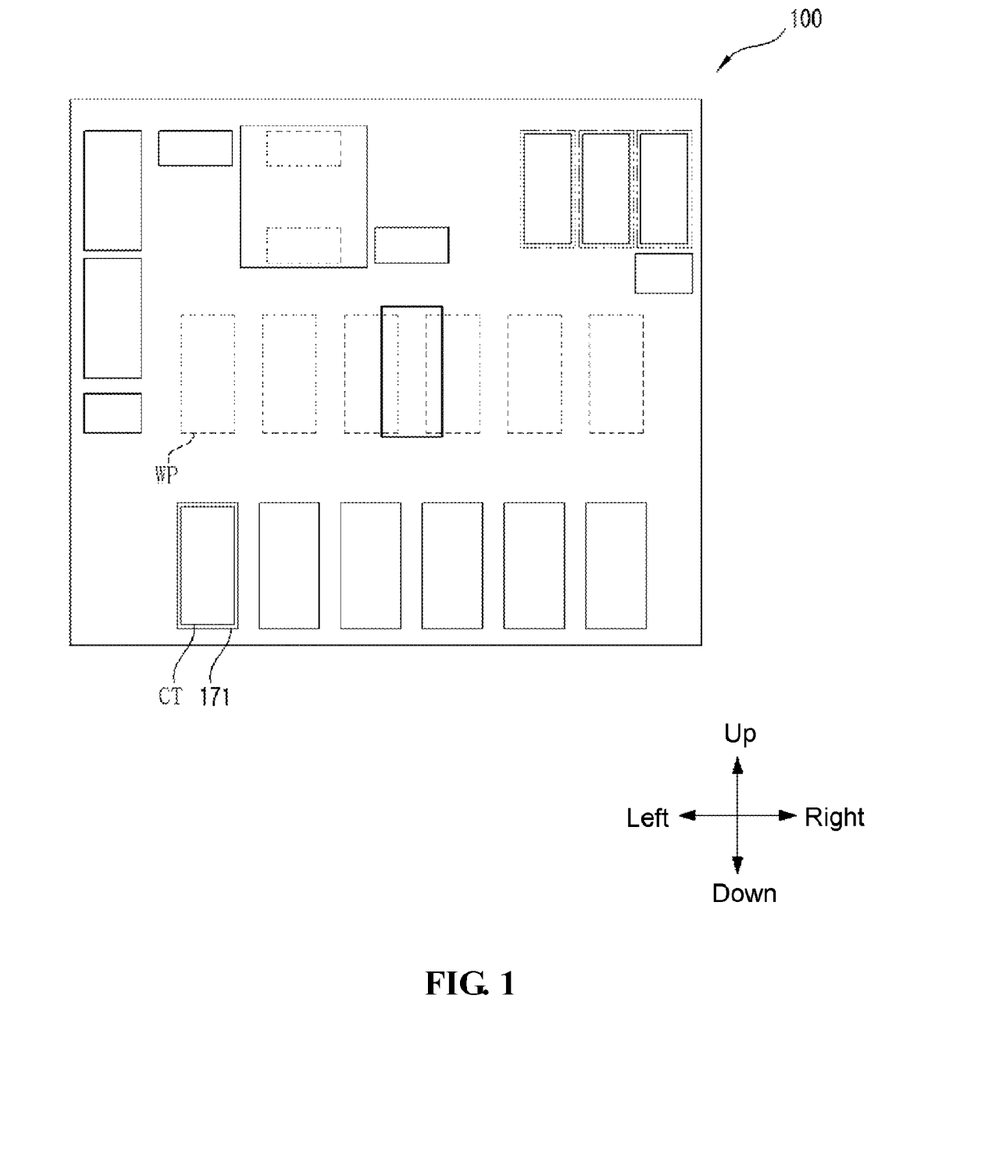
FIG. 1 and FIG. 2 are views for explaining limitations of typical handlers.
Figure 2:
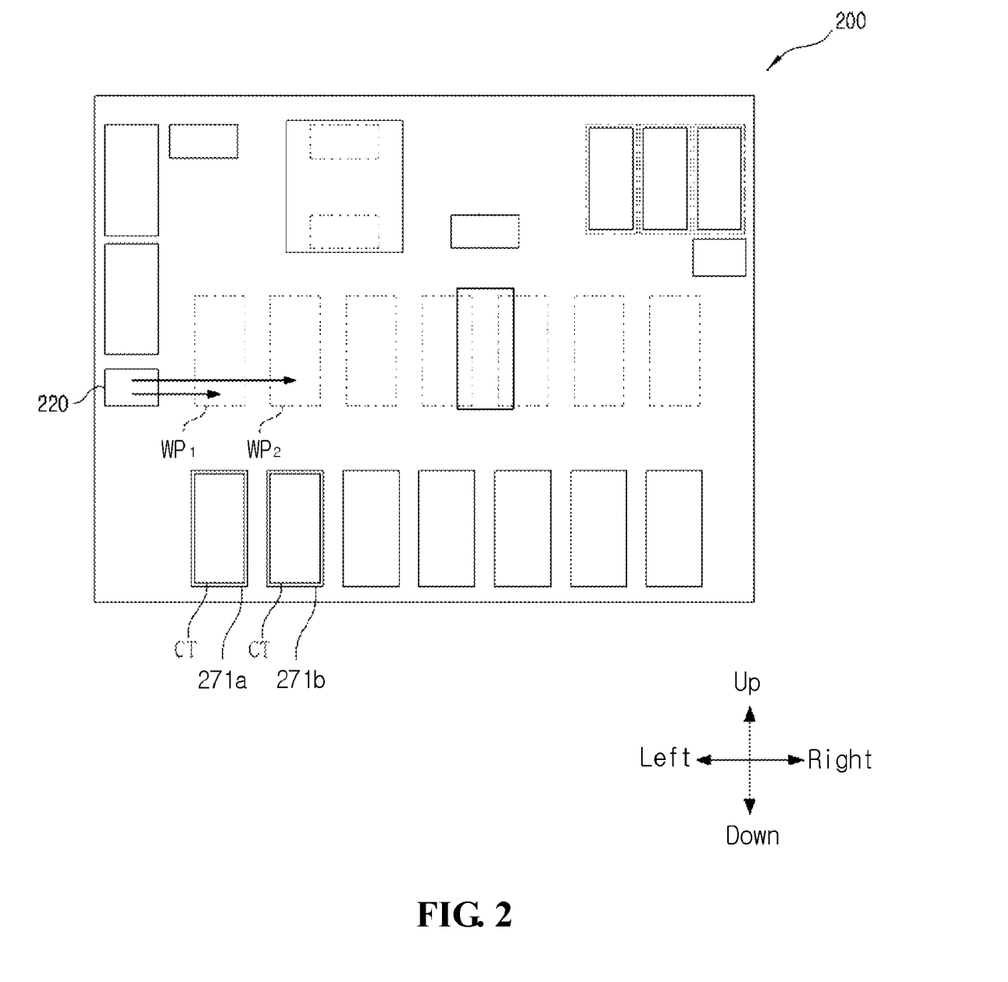

Therefore, instead of fabricating the handler 100 having one supplying stacker 171 and one withdrawing position WP, at which the semiconductor device is withdrawn as illustrated in FIG. 1, an improved handler 200 including supplying stackers 271*a* and 271*b* and withdrawing positions WP1 and WP2 may be considered. However, according to the improved handler 200, not only does the size of equipment become larger, but the design and control of a device moving unit 200 for withdrawing and moving the semiconductor device from the customer tray CT at the withdraw positions WP1 and WP2 become complex.

In addition, because the handler disclosed in Patent Applications Nos. 10-2013-0052809 and 10-2013-0055510, which have been filed by the applicant, includes a structure to move the customer tray loaded in the stacker to the withdrawing position by a lower belt, an additional belt structure is required when multiple supplying stackers are provided.

Therefore, spaces are wasted and fabrication costs are increased. Further, when the semiconductor devices are fabricated in a normal quantity, the additional supplying stacker 271*b* is rarely utilized.

It may also be considerable to increase a vertical height of the stacker for increasing a loading quantity of the customer trays which are vertically loaded in the stacker, but this increases the size of the equipment, and the customer tray loading work of the worker becomes cumbersome due to the increased height of the equipment.

SUMMARY OF THE INVENTION

An object of the present invention is to provide a technology for appropriately dealing with a quantity variation of semiconductor devices to be tested by improving the operability of a stacker.

To achieve the object, a handler for testing a semiconductor device according an embodiment of the present invention includes: a test supporting part to withdraw a semiconductor device loaded in a customer tray at a withdrawing position to electrically connect the semiconductor device to a tester, and insert the semiconductor device into the customer tray at an inserting position after a test of the semiconductor device is completed by the tester; and a customer tray receiving and supplying part to move the customer tray, in which the semiconductor device to be tested is loaded, to the withdrawing position or move the customer tray, in which the semiconductor device is loaded after the test is completed, from the inserting position to support a smooth movement of the semiconductor devices in association with an operation of the test supporting part, wherein the customer tray receiving and supplying part includes: a plurality of supplying stackers to accommodate the customer tray to be moved to the withdrawing position; a first tray moving device to move the customer tray loaded in the supplying stackers to the withdrawing position; a position selecting device to move the supplying stackers so that one of the supplying stackers is positioned at a supplying position (a position to move the customer tray to the withdrawing position); at least one accommodating stacker to accommodate the customer tray positioned at the inserting position; and at least one second tray moving device to move the customer tray at the inserting position to the at least one accommodating stacker.

A number of the supplying stackers may be more than a number of the withdrawing positions, and the customer tray loaded in the supplying stackers may be moved to a same withdrawing position through the first tray moving device.

The supplying stackers may include a detecting sensor to detect whether the customer tray is loaded, and the position selecting device may select the supplying stacker, in which the customer tray exists, and move the supplying stacker to the supplying position when the detecting sensor detects that the supplying stacker in the current supplying position has no customer tray.

To achieve the object, a handler for testing a semiconductor device according to another embodiment of the present invention includes: a test supporting part to withdraw a semiconductor device loaded in a customer tray at a withdrawing position to electrically connect the semiconductor device to a tester, and insert the semiconductor device into the customer tray at an inserting position after a test of the semiconductor device is completed by the tester; and a customer tray receiving and supplying part to move the customer, in which the semiconductor device to be tested is loaded, to the withdrawing position or move the customer tray, in which the semiconductor device is loaded after the test is completed, from the inserting position, wherein the customer tray receiving and supplying part includes: multiple stackers, in which the customer tray to be moved to the withdrawing position is loaded or the customer tray moving from the inserting position is accommodated; a plurality of tray moving devices to move the customer tray loaded in at least one of the stackers to the withdrawing position, and move another at least one of the stackers from the inserting position; and a position selecting device to move at least one of the stackers to select a position of the at least one stacker.

At least one of the stackers may include one of a first detecting sensor to detect whether the customer tray is full and a second detecting sensor to detect whether the customer tray is loaded, and wherein the position selecting device moves at least one of the stackers based on information detected by the first detecting sensor and the second detecting sensor.

According to the present invention, the handler for testing a semiconductor device may have the following effects due an efficient operation of the stacker.

First, a large amount of semiconductor devices can be continuously tested in the same test process.

Second, the wasted space and production costs can be reduced by preventing an enlargement or a complex design of equipment.

Third, manpower can be saved and an operating rate can be improved.

Fourth, the semiconductor devices in mutually different lots can be continuously tested.

DETAILED DESCRIPTION OF THE INVENTION

Hereinafter, an exemplary embodiment according to the present invention is described with reference to the drawings. For a concise description, repetitive descriptions are omitted or summarized.

Figure 3:
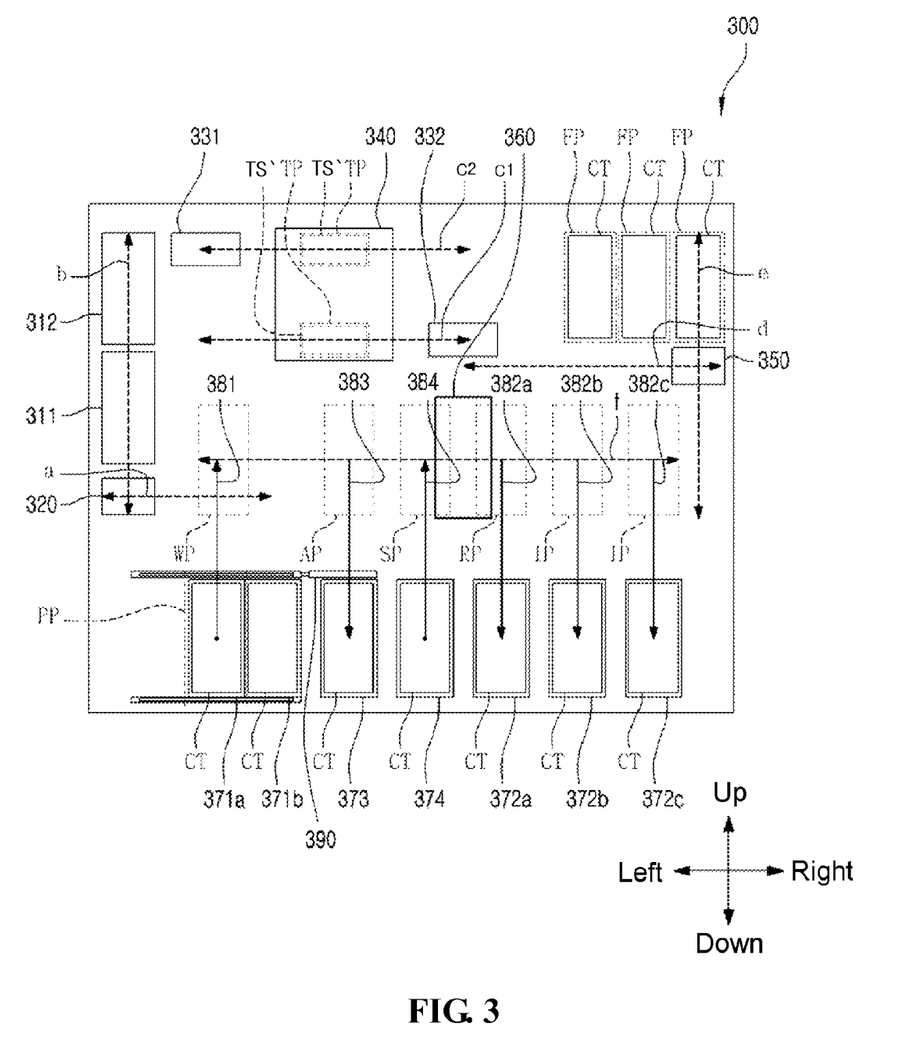
FIG. 3 is a schematic plan view of a handler for testing a semiconductor device according to an embodiment of the present invention.

FIG. 3 is a schematic plan view of a handler 300 according to an embodiment of the present invention.

As illustrated in FIG. 3, the handler 300 according to the present invention includes a pair of loading plates 311 and 312, a first device moving unit 320, a pair of test shuttles 331 and 332, a connecting device 340, a second device moving unit 350, a tray moving device 360, a first supplying stacker 371a, a second supplying stacker 371b, first accommodating stackers 372a, 372b and 372c, a second accommodating stacker 373, a standby stacker 374, a first tray moving device 381, second tray moving devices 382a, 382b and 382c, a third moving device 383, a fourth tray moving device 384 and a position selecting device 390.

Semiconductor devices may be loaded on the loading plates 311 and 312. The loading plates 311 and 312 may have a heater. Therefore, the loaded semiconductor devices may be heated to a temperature required for a test. An operation of the heater is interrupted when testing at a room temperature.

The first device moving unit 320 withdraws the semiconductor device from a customer tray CT at a withdrawing position WP and loads the semiconductor device on the loading plates 311 and 312. In addition, the first device moving unit 320 moves the semiconductor device on the loading plates 311 and 312 to the test shuttles 331 and 332 positioned to the left in the drawing. The first device moving unit 320 is movable in the transverse direction and the longitudinal direction (refer to dotted arrows a and b).

The test shuttles 331 and 332 may load the semiconductor device. The test shuttles 331 and 332 may move in the transverse direction and pass through a test position TP (refer to dotted arrows $c_1$ and $c_2$).

The connecting device 340 electrically connects the semiconductor device loaded in the test shuttles 331 and 332 at the test position TP to a test socket TS' below the test position TP. In this case, the electrical connection between the semiconductor device and the test socket TS' is performed by the connecting device 340 pressing the semiconductor device loaded on the test shuttles 331 and 332. The semiconductor device is electrically connected to the tester through the test socket TS'.

The second device moving unit 350 inserts the semiconductor devices in the test shuttles 331 and 332, which are positioned to the right in the drawing, into the customer tray CT at a retesting position RP, an inserting position IP, and a fixing position FP while classifying the semiconductor devices according to the test result after the test is completed. The retesting position RP is a position at which the semiconductor device to be retested is inserted into the customer tray. The inserting position (IP) is a position at which the semiconductor device, which passed the test, is inserted into the customer tray CT. The fixing position FP is a position at which the semiconductor devices excluding the semiconductor, which passed the test or is to be retested, are inserted into the customer tray. The second device moving unit 350 is movable in the transverse direction and the longitudinal direction (refer to dotted arrows d and e). Roles or mutual positions of the retesting position RP, the inserting position IP and the fixing position FP may be varied according to needs of users.

The tray moving device 360 moves the customer tray CT between a withdrawing position WP, an accommodating position AP, the retesting position RP, the inserting position IP and a standby position SP. The tray moving device 360 is movable in the transverse direction (refer to dotted arrow f).

The pair of loading plates 311 and 312, the first device moving unit 320, the pair of test shuttles 331 and 332, the connecting device 340, the second device moving unit 350 and the tray moving device 360 may be grouped as a test supporting part. That is, the test supporting part withdraws the semiconductor device loaded in the customer tray CT at the withdrawing position WP to electrically connect the semiconductor device to the tester, and inserts the semiconductor device to the customer tray CT at the inserting position IP while classifying the semiconductors according to the test result after the test is completed.

Structures of the stackers of the first supplying stacker 371a, the second supplying stacker 371b, the first accommodating stackers 372a, 372b and 372c, the second accommodating stacker 373, the standby stacker 374, and structures of the tray moving devices such as the first tray moving device 381, the second tray moving devices 382a, 382b and 382c, the third moving device 383, the fourth tray moving device 384 are disclosed in Patent Application Nos. 10-2013-0052809 and 10-2013-0055510, which have been filed by the applicant. Therefore, a detailed description of the structure and operations of the stackers and the moving devices are omitted in the following description.

The first supplying stacker 371a and the second supplying stacker 371b accommodates the customer tray CT in which the semiconductor device is loaded.

One lot of semiconductor devices is separately loaded on multiple customer trays CT. In addition, the customer trays CT are separately accommodated in the first supplying stacker 371a and the second supplying stacker 371b.

Or, the customer tray, in which the lot of semiconductor devices to be tested first is loaded, may be accommodated in the first supplying stacker 371a, and the customer tray, in which the lot of semiconductor devices to be tested later is loaded, may be accommodated in the second supplying stacker 371b.

The customer trays CT stacked on the first supplying stacker 371a and the second supplying stacker 371b are moved to the withdrawing position WP one at a time by the first tray moving device 381.

Figure 4:
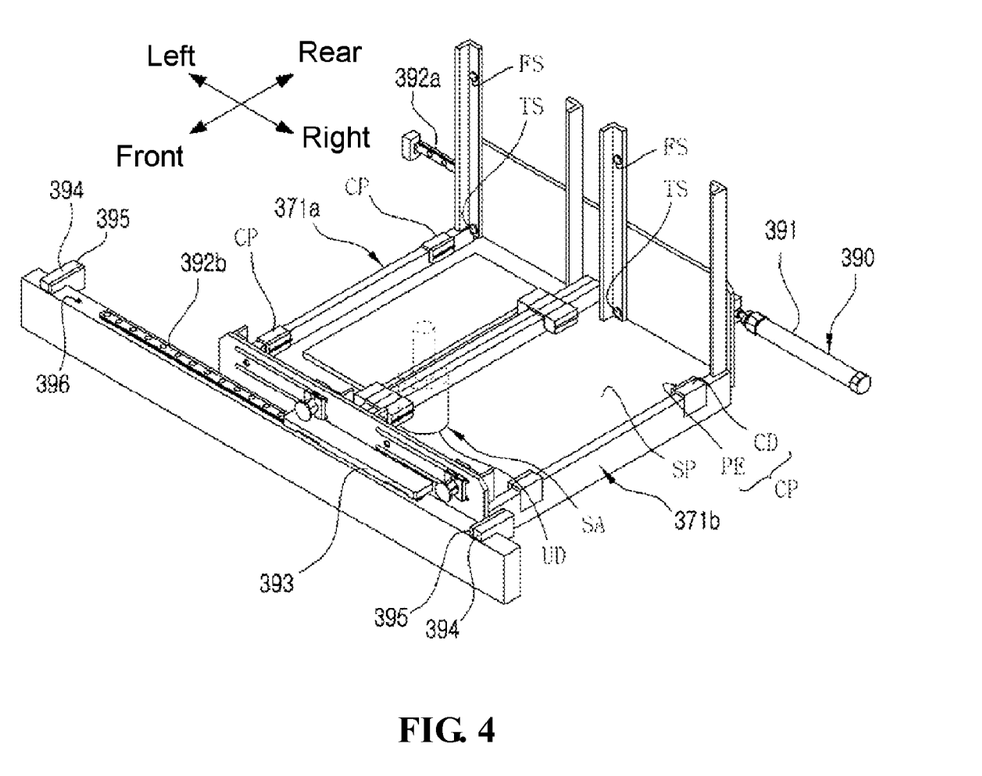
FIG. 4 is a schematic perspective view of a main part of the handler.

As illustrated in FIG. 4, the first supplying stacker 371a and the second supplying stacker 371b are transversely arranged side by side in adjacent to each other. The first supplying stacker 371a and the second supplying stacker 371b are coupled to each other. Therefore, the first supplying stacker 371a and the second supplying stacker 371b move together in the transverse direction. When the first supplying stacker 371a and the second supplying stacker 371b are capable of loading each of the customer trays CT, respectively, any form or structure such as being adjacent with each other, spaced apart from each other, etc. are possible.

The first supplying stacker 371a and the second supplying stacker 371b include clampers CP to support or release the support of the vertically stacked customer trays CT.

The clamper CP includes a supporting member PE and a cylinder CD.

The supporting member PE supports the customer tray CT.

The cylinder CD horizontally moves the supporting member PE back and forth. Therefore, the customer tray CT, on which the supporting member PE is stacked, may be supported or the support may be released. The cylinder CD may be replaced by a motor, etc.

Three or more supplying stackers may be provided according to embodiments. In addition, each supplying stacker may not be coupled to each other and may be individually moved. That is, various variations of the supplying stackers to be moved may exist.

The first supplying stacker 371a and the second supplying stacker 371b include a first detecting sensor FS to detect whether the customer tray CT is fully loaded. In addition, the first supplying stacker 371a and the second supplying stacker 371b include a second detecting sensor TS to identify whether the customer tray CT is loaded.

In reference, the symbol SA illustrated below the first supplying stacker 371a in FIG. 4 illustrates a supporting apparatus. The supporting apparatus SA supports the customer tray CT when the clamper CP releases the support of the customer tray CT. The supporting apparatus SA includes a supporting plate SP and an up and down device UD. The supporting plate SP supports the customer tray CT. The up and down device UD elevates the supporting plate SP. The supporting apparatus SA is also provided below each of the first accommodating stackers 372a, 372b and 372c, the second accommodating stacker 373 and the standby stacker 374. The supporting apparatus SA is involved in an operation of moving the stacked customer trays CT to a rear side. The supporting device SA below the first supplying stacker 371a is involved in the movement of the customer tray CT stacked in the second supplying stacker 371b. The technology related to the movement of the customer tray CT is described in detail in FIG. 8 to FIG. 17 in the Patent Application No. 10-2013-0055510, which has been filed by the applicant. Therefore, a detailed description is omitted.

The first accommodating stackers 372a, 372b and 372c accommodate the customer tray CT moving from the retesting position RP or the inserting position IP by an operation of the second tray moving devices 382a, 382b and 382c.

The second accommodating stacker 373 accommodates the customer tray CT passing through the accommodating position AP after all of the semiconductor devices loaded at the withdrawing position WP are withdrawn by the first device moving unit 320.

The standby stacker 374 accommodates the empty customer trays CT to be supplied to the standby position SP, at which the customer tray CT to be moved to the retesting position RP or the inserting position IP are standing by. That is, the empty customer tray CT accommodated and loaded in the standby stacker 374 is moved to the standby position SP one at a time by the fourth tray moving device 384. In addition, the customer tray CT at the standby position SP is moved to the retesting position RP or the inserting position IP by the tray moving device 360.

The first tray moving device 381 moves the customer tray CT accommodated and loaded in the first supplying stacker 371a or the second supplying stacker 371b to the withdrawing position WP one at a time.

The second tray moving devices 382a, 382b and 382c move the customer tray CT at the retesting position RP or the inserting position IP to the first accommodating stackers 372a, 372b and 372c.

The third tray moving device 383 moves the customer tray CT at the accommodating position AP to the second accommodating stacker 373.

The fourth tray moving device 384 moves the empty customer tray CT accommodated in the standby stacker 374 one at a time to the standby position SP.

The position selecting device 390 moves the first supplying stacker 371a and the second supplying stacker 371b, which are mutually coupled, in the transverse direction. Therefore, the first supplying stacker 371a is positioned at a supplying position PP or the second supplying stacker 371b is positioned at the supplying position PP. In this case, the supplying position PP is a position, from which the customer tray CT stacked in the first supplying stacker 371a and the second supplying stacker 371b is moved to the withdrawing position WP. The position selecting device 390, as illustrated in FIG. 4, includes a cylinder 391, a pair of guiders 392a and 392b, a moving member 393, a stopper 394, an absorber 395 and a position detecting sensor 396.

The cylinder 391 provides a moving force for moving the first supplying stacker 371a and the second supplying stacker 371b in the transverse direction. The cylinder 391 may be replaced by various driving units such as a motor, etc. which may move the first supplying stacker 371a and the second supplying stacker 371b in the transverse direction.

The guiders 392a and 392b guide the first supplying stacker 371a and the second supplying stacker 371b to move in the transverse direction.

The moving member 393 is coupled to the first supplying stacker 371a and the second supplying stacker 371b. In addition, the moving member 393 is movably coupled to the guiders 932a and 392b. Furthermore, the moving member 393 moves in the transverse direction according to the guide of the guiders 392a and 392b. Therefore, the moving member 393 moves together with the first supplying stacker 371a and the second supplying stacker 371b.

The stopper 394 prevents the first supplying stacker 371a and the second supplying stacker 371b from excessively moving.

The absorber 395 is coupled to the stopper 394. The absorber 395 absorbs an impact and shock between the moving member 393 and the stopper 394.

The position detecting sensor 396 detects which one of the first supplying stacker 371a and the second supplying stacker 371b is positioned at the supplying position PP. That is, the position detecting sensor 396 detects the stacker of the first supplying stacker 371a and the second supplying stacker 371b from which the customer tray CT is supplied to the withdrawing position WP.

The position detecting sensor 395 makes it possible to identify whereabouts of the supply currently being supplied. For example, when the customer trays CT, on which the semiconductor devices of mutually different lots are loaded, are separately stacked in the first supplying stacker 371a and the second supplying stacker 371b, respectively, which lot of semiconductor devices are currently supplied to the test supporting part may be identified by the position detecting sensor 396. In the embodiment, the position detecting sensor 396 detects the position of the moving member 393. However, according to embodiments, the position detecting sensor 396 may detect whether a load of the cylinder is moving back and forth. In addition, the position detecting sensor may be installed in the stopper. In addition, the position sensor may be separately installed in the supplying position PP, the first supplying stacker 371a and the second supplying stacker 371b such that the position of the first supplying stacker 371a and the second supplying stacker 371b is sensed by a mutual recognition.

The first supplying stacker 371a, the second supplying stacker 371b, the first accommodating stacker 372a, 372b and 372c, the second accommodating stacker 373 and the standby stacker 374 or the first tray moving device 381, the second tray moving device 382a, 382b and 382c, the third tray moving device 383 and the fourth tray moving device 384 may be grouped as a tray accommodating part. That is, the tray accommodating part assists smooth movements of the semiconductor devices according to the operation of the test supporting part by supplying or accommodating the customer tray CT.

Hereinafter, a method of testing the handler 300 including the above configuration will be described.

First, as illustrated in FIG. 3, while the first supply stacker 371a is positioned at the supplying position PP, the first tray moving device 381 moves the customer tray CT stacked in the first supplying stacker 371a to the withdrawing position WP one at a time.

The first device moving unit 320 withdraws the semiconductor device to be tested from the customer tray CT at the withdrawing position WP to load the semiconductor device in the loading plates 311 and 312. In addition, the first device moving unit 320 moves the semiconductor device loaded in the loading plates 311 and 312 to the test shuttles 331 and 332 positioned at the left and loads the semiconductor device on the test shuttles 331 and 332.

The test shuttles 331 and 332, in which the semiconductor device to be tested is loaded, moves to the right and is positioned at the testing position TP. The connecting device 340 presses the semiconductor device loaded in the test shuttle 331 and 332 at the testing position downward. Therefore, the semiconductor device is electrically connected to the test socket TS'. In addition, the semiconductor device is tested.

When the test is completed, the electrical connection between the semiconductor device and the test socket TS' is released, and the test shuttles 331 and 332 further move to the right. The second moving device 350 withdraws the semiconductor device from the test shuttles 331 and 332 positioned at the right after the test is completed. In addition, the second moving device 350 inserts the semiconductor devices into the customer tray at the retesting position RP, the inserting position IP and the fixing position FP while classifying according to the test result.

Meanwhile, the customer tray CT, from which all of the semiconductor devices loaded at the withdrawing position WP are withdrawn, is moved to the accommodating position AP by the tray moving device 360. In addition, the customer tray CT at the accommodating position AP is moved to and stored in the second accommodating stacker 373 by the third tray moving device 383.

In addition, when the customer tray CT at the retesting position RP and the inserting position IP is filled with the semiconductor devices, the customer tray CT at the retesting position RP and the inserting position IP is moved to and stored in the first accommodating stackers 372a, 372b and 372c by the second tray moving devices 382a, 382b and 382c. Accordingly, the customer tray CT is removed from the retesting position RP and the inserting position IP. The fourth tray moving device 384 moves an empty customer tray CT from the standby stacker 374 to the standby position SP in advance. In addition, the empty customer tray CT at the standby position SP is moved to the retesting position RP or the inserting position by the tray moving device 360. According to embodiments, the empty customer tray CT at the withdrawing position WP may be moved to the standby position SP by the tray moving device 360, and the empty customer tray CT at the withdrawing position WP may be directly moved to the retesting position RP or the inserting position IP.

Figure 5:
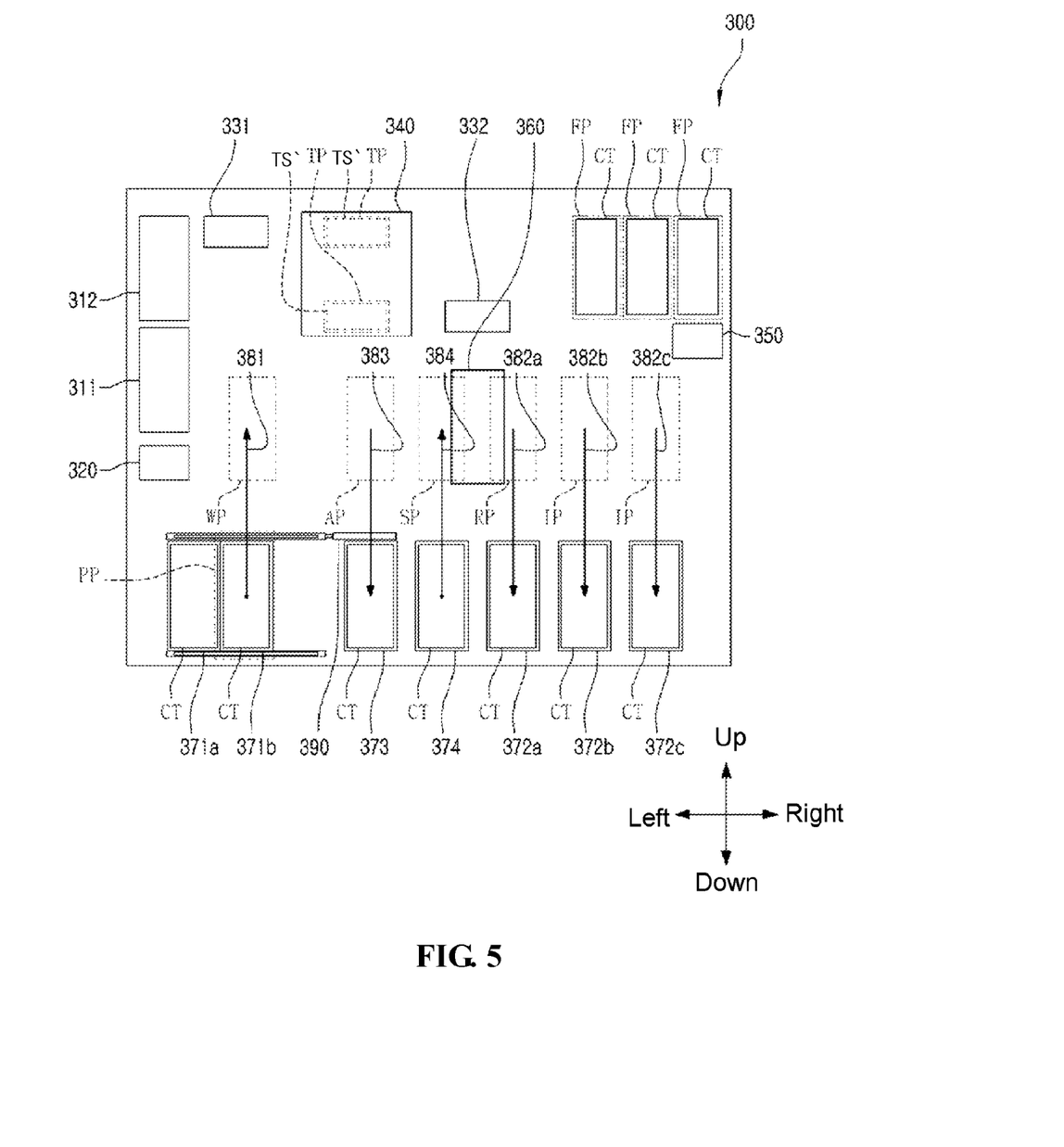
FIG. 5 is a reference view for explaining an operation of the handler.

By the process, every semiconductor device loaded in the customer tray CT accommodated in the first supplying stacker 371a is supplied to the test supporting part. In addition, the second detecting sensor TS of the first supplying stacker 371a detects whether all of the customer trays CT are emptied from the first supplying stacker 371a. When the first supplying stacker 371a is completely emptied, as illustrated in FIG. 5, the position selecting device 390 is operated to move the positions of the first supplying stacker 371a and the second supplying stacker 371b so that the second supplying stacker 371b is positioned at the supplying position PP. Accordingly, the customer tray CT accommodated in the second supplying stacker 371b is moved to the withdrawing position WP one at a time by the first tray moving device 381.

Meanwhile, when the customer tray CT of the first supplying stacker 371a is emptied, the position selecting device 390 is operated such that a notification is provided while positioning the second supplying stacker 371b at the supplying position PP. In this case, a user who hears the notification may stack the customer tray CT, in which the semiconductor device to be tested is loaded, in the first supplying stacker 371a.

In addition, when the first supplying stacker 371a at the supplying position PP has no customer tray, whether the customer tray CT exists at the second supplying stacker 371b is identified. When the customer tray CT exists at the second supplying stacker 371b, the position selecting device 390 moves the second supplying stacker 371b to the supplying position PP. When the customer tray CT is not in the second supplying stacker 371b, only an alarm is generated.

Furthermore, when there are three or more supplying stackers and the supplying stacker in the current supplying position has no customer tray, whether the supplying stacker having the customer tray among the other supplying stackers exist is identified. In addition, the supplying stacker having the customer tray is moved to the supplying position.

In addition to the embodiments, the present invention may be applied to the standby stacker or the accommodating stacker to allow a variety of operations of the stackers.

When a movement of the accommodating stacker is taken into consideration, different from the supplying stacker, the accommodating stacker is moved when the accommodating stacker is filled with the customer tray. In this case, the sensor to detect whether the accommodating stacker is full of the customer tray is operated.

In addition, moving three or more stackers together may be taken into consideration. Further, moving each of the stacker individually may be taken into consideration.

Furthermore, the handler of the present invention may be applied to the handlers having the test supporting part in a form different from the test supporting part of the embodiment.

That is, the handler of the present invention may be effectively applied when the number of corresponding stackers is more than the withdrawing position WP, the accommodating position AP, the retesting position RP, the inserting position IP and the standby position SP.

While the present invention has been particularly shown and described by embodiments with reference to the accompanied drawings, it should not be interpreted in any way to limit the scope of the present invention. Therefore, the scope of the present invention is not limited to the described embodiments, but is limited only by the accompanying claims and equivalents thereof, and any alterations equivalent to the accompanying claims are within the scope of the present invention.

What is claimed is:

1. A handler for testing a semiconductor device, the handler comprising:
    a test supporting part to withdraw a semiconductor device loaded in a customer tray at a withdrawing position to electrically connect the semiconductor device to a tester, and insert the semiconductor device into the customer tray at an inserting position after a test of the semiconductor device is completed by the tester; and
    a customer tray receiving and supplying part to move the customer tray, in which the semiconductor device to be tested is loaded, to the withdrawing position or move the customer tray, in which the semiconductor device is loaded after the test is completed, from the inserting position to support a movement of the semiconductor devices in association with an operation of the test supporting part, wherein
    the customer tray receiving and supplying part comprises:
    a plurality of supplying stackers to accommodate the customer tray to be moved to the withdrawing position;
    a first tray moving device to move the customer tray loaded in the supplying stackers to the withdrawing position;
    a position selecting device to move the supplying stackers so that one of the supplying stackers is positioned at a supplying position that is a position to move the customer tray to the withdrawing position;
    at least one accommodating stacker to accommodate the customer tray positioned at the inserting position; and
    at least one second tray moving device to move the customer tray at the inserting position to the at least one accommodating stacker;
    wherein
    the supplying stackers comprise:
        a first detecting sensor to detect whether the customer tray is fully loaded,
        a second detecting sensor to detect whether the customer tray is loaded,
        wherein the first detecting sensor is disposed above the second detecting sensor, and
    the position selecting device selects the supplying stacker, in which the customer tray exists, and moves the supplying stacker to the supplying position when the detecting sensor detects that the supplying stacker in the current supplying position has no customer tray.

2. The handler according to claim 1, wherein
    a number of the supplying stackers is more than a number of the withdrawing positions, and
    the customer tray loaded in the supplying stackers is moved to a same withdrawing position through the first tray moving device.

3. A handler for testing a semiconductor device, the handler comprising:
    a test supporting part to withdraw a semiconductor device loaded in a customer tray at a withdrawing position to electrically connect the semiconductor device to a tester, and insert the semiconductor device into the customer tray at an inserting position after a test of the semiconductor device is completed by the tester; and
    a customer tray receiving and supplying part to move the customer, in which the semiconductor device to be tested is loaded, to the withdrawing position or move the customer tray, in which the semiconductor device is loaded after the test is completed, from the inserting position, wherein
    the customer tray receiving and supplying part comprises:
    multiple stackers, in which the customer tray to be moved to the withdrawing position is loaded or the customer tray moving from the inserting position is accommodated;
    a plurality of tray moving devices to move the customer tray loaded in at least one of the stackers to the withdrawing position, and move another at least one of the stackers from the inserting position; and
    a position selecting device to move at least one of the stackers to select a position of the at least one stacker; wherein
    at least one of the stackers comprises a first detecting sensor to detect whether the customer tray is full and a second detecting sensor to detect whether the customer tray is loaded, and wherein
    the position selecting device moves at least one of the stackers based on information detected by the first detecting sensor and the second detecting sensor, and
    the first detecting sensor is disposed above the second detecting sensor.

* * * * *